United States Patent [19]

Klos

[11] Patent Number: 5,475,874
[45] Date of Patent: Dec. 12, 1995

[54] METHOD FOR THE TUNING OF A BROADCAST RADIO RECEIVER USING RDS INFORMATION

[75] Inventor: Rainer Klos, Ettlingen, Germany

[73] Assignee: Becker GmbH, Karlsbad, Germany

[21] Appl. No.: 244,305

[22] PCT Filed: Sep. 29, 1993

[86] PCT No.: PCT/EP93/02648

§ 371 Date: May 25, 1994

§ 102(e) Date: May 25, 1994

[87] PCT Pub. No.: WO94/08407

PCT Pub. Date: Apr. 14, 1994

[30] Foreign Application Priority Data

Oct. 2, 1992 [DE] Germany ............... 42 33 282.6

[51] Int. Cl.$^6$ .................................................. H04B 1/16
[52] U.S. Cl. .................................. 455/161.2; 455/186.1
[58] Field of Search ........................... 455/161.1, 184.1, 455/186.1, 186.2, 161.2, 185.1, 152.1, 345

[56] References Cited

U.S. PATENT DOCUMENTS

| | | | |
|---|---|---|---|
| 4,253,194 | 2/1981 | Van Deursen | 455/161.1 |
| 4,881,273 | 10/1989 | Koyama et al. | 455/161.1 |
| 5,220,682 | 6/1993 | Tomohiro | 455/184.1 |
| 5,303,401 | 4/1994 | Duckeck et al. | 455/186.1 |
| 5,345,607 | 9/1994 | Liman et al. | 455/186.1 |

FOREIGN PATENT DOCUMENTS

| | | |
|---|---|---|
| 0498233 | 8/1992 | European Pat. Off. . |
| 0503154 | 9/1992 | European Pat. Off. . |
| 4103779 | 8/1992 | Germany . |
| 4106852 | 9/1992 | Germany . |
| 02213229 | 8/1990 | Japan . |
| 02301330 | 12/1990 | Japan . |
| 03034630 | 2/1991 | Japan . |
| 2214739 | 9/1989 | United Kingdom . |

OTHER PUBLICATIONS

Supplement 3 to Tech.3244–3, European Broadcasting Union, Jul. 1989, Brussels, BE, pp. 1–3.
Friedman, Herb: Radio Data System. In: Radio Electronics, H. 12, 1988, S.65–68, u.76; vgl. insb. Fig. 3a.
N.N.: Orientierung im Senderwald. In: ELO, Apr. 1989, S.97–98.

*Primary Examiner*—Edward F. Urban
*Assistant Examiner*—Marsha D. Banks-Harold
*Attorney, Agent, or Firm*—Sixbey, Friedman, Leedom & Ferguson; Gerald J. Ferguson, Jr.; Eric J. Robinson

[57] ABSTRACT

For the tuning of a broadcast radio receiver to a transmitter of a certain type of program using RDS information firstly the broadcast radio receiver is tuned to any convenient transmitter, which is transmitting a program, which is in accordance with the wishes of the listener. The PTY information retrieved from the RDS data of such transmitter is stored by operation of an associated control element in order to set a filter, whose filter condition is the agreement with such PTY information. For the following tuning of the broadcast radio receiver to another transmitter, as for example by means of a search sweep, such transmitter is only considered to be suitable for reception if it fulfills the filter condition.

5 Claims, 1 Drawing Sheet

METHOD FOR THE TUNING OF A BROADCAST RADIO RECEIVER USING RDS INFORMATION

The invention relates to a method for the tuning of a broadcast radio receiver to a transmitter of a certain type of program using RDS information.

Using information provided by the RDS (radio data system) the user of a broadcast radio receiver in principle has the possibility of only selecting those transmitters which are able to be received at the site of reception and which broadcast a particular type of program. Such information includes PTY information (program type information), which by means of a standardized characteristic indicates the type of program, which is broadcast by the respective transmitter, as for instance news services, sporting news, entertainment music or classical music.

In order to employ RDS information for the selection of a certain program type it is necessary for the listener to operate some sort of control element of the radio set with which the set may be adjusted to the desired program type. For this purpose it is possible to use, for instance, a switch able to be changed over between different program types, each type of program being indicated in a display panel. Such a method of setting may well be suitable for stationary broadcast receivers; in the case of a mobile radio receiver, however, more particularly a car radio, its operation requires too much effort and attention, since a systematic selection is scarcely feasible without reading the indicated type of program.

While the tuning method in accordance with the invention is more especially suitable for mobile broadcast receivers such as car radios, it is however also advantageous when applied to stationary broadcast receivers in order to simplify the operation thereof.

In the method in accordance with the invention for the tuning of a broadcast radio receiver to a transmitter of a particular type of program using RDS information firstly the broadcast radio receiver, for instance by means of a sweep search, is tuned to any convenient transmitter which has a program meeting the wishes of the listener. From RDS information, which is broadcast by the selected transmitter along with the program, the information indicating the type of program (PTY information) is obtained. By the operation of an associated control knob a filter is then set, whose filter condition is in agreement with the information characterizing such a type of program. When then later tuning the broadcast radio receiver to another transmitter, for instance again by means of a sweep search, information thereof as well characterizing the type of program is obtained. Finally each and every transmitter then tuned in is solely taken into account as being suitable for reception, if it complies with the filter condition.

In the case of this method the listener does not have to know the selected type of program. If for example he has set the filter while tuned to a transmitter broadcasting sporting news, then in the course of an ensuing search sweep only those transmitters will be offered as are also transmitting sporting news.

Preferably such a set filter may be disabled by renewed operation of the control element.

The method in accordance with the invention renders it possible to tune a broadcast radio receiver systematically to a desired type of program by only operating two control elements, for example a knob with which a station search sweep is commenced, and a knob, with which the filter is enabled or disabled. For instance it is possible for a car radio receiver to be equipped with only two such control elements, which may be operated quickly and easily without looking at them, instead of with a plurality of control elements.

It is convenient if the condition of the filter (i.e. enabled or disabled) is indicated by means of a separate indicating element, as for example by means of an indicating lamp integrated in a control knob.

The method in accordance with the invention opens up various possibilities for advantageous developments.

In accordance with a first advantageous development the invention a table of alternative transmitters is written in the broadcast radio receiver by a periodically or continuously performed search sweep in such a manner that the table only includes such transmitters as fulfill the set filter condition. The broadcast radio receiver may now be re-tuned, manually or automatically, to an alternative transmitter for example because the reception quality is too poor.

In accordance with a further advantageous development the broadcast radio set is provided with a separate control element, as for example a knob labeled "BEST" in order to start a search sweep, the reception quality of every transmitter found which complies with the filter condition and an evaluation, which denotes it, being temporarily stored along with the transmitter's frequency in order finally to tune to that frequency of the transmitter frequencies stored, whose evaluation yields the best reception quality. By operating the separate control element once the listener using the radio receiver is consequently able to tune in to that transmitter, which offers the desired type of program with the optimum reception quality.

Further features of the method will be described with reference to the drawings in more detail.

The method will now be described using a car radio as an example, seeing that in the case of such a receiver the advantages of the method are of particular consequence.

Figure 1:
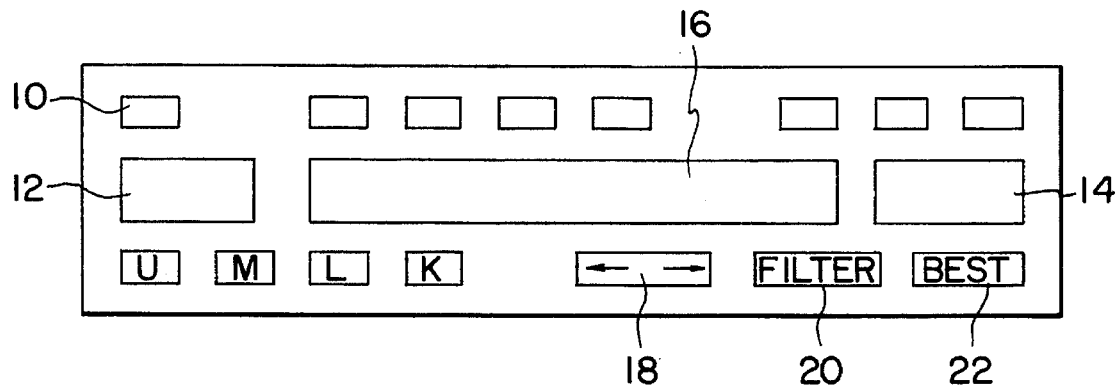
FIG. 1 shows the front control panel of a mobile broadcast radio receiver.

In the case of the example of a front control panel depicted in FIG. 1 of a car radio the various control elements are arranged in three superposed rows. In the first row there is an ON-OFF switch, which is referenced 10. There are then further control elements in the form of knobs whose functions will not be described here in any detail.

In the second row an alphanumeric indicating panel 16 is arranged between two control elements 12 and 14 of large area.

In the third row there are firstly four knobs for the wave length ranges, which are denoted U, M, L and K. After this there are three further knobs 18, 20 and 22. The knob 18 is a rocker switch which serves for starting a transmitter search sweep in either direction. The knob 20 bears the label "FILTER" and simultaneously serves as an optical indicating means, since the knob can be illuminated from the inside. The third knob 22 bears the label "BEST" and serves for tuning the broadcast radio receiver to that transmitter with a desired type of program, which at the time is broadcasting with the best reception quality.

Figure 2:
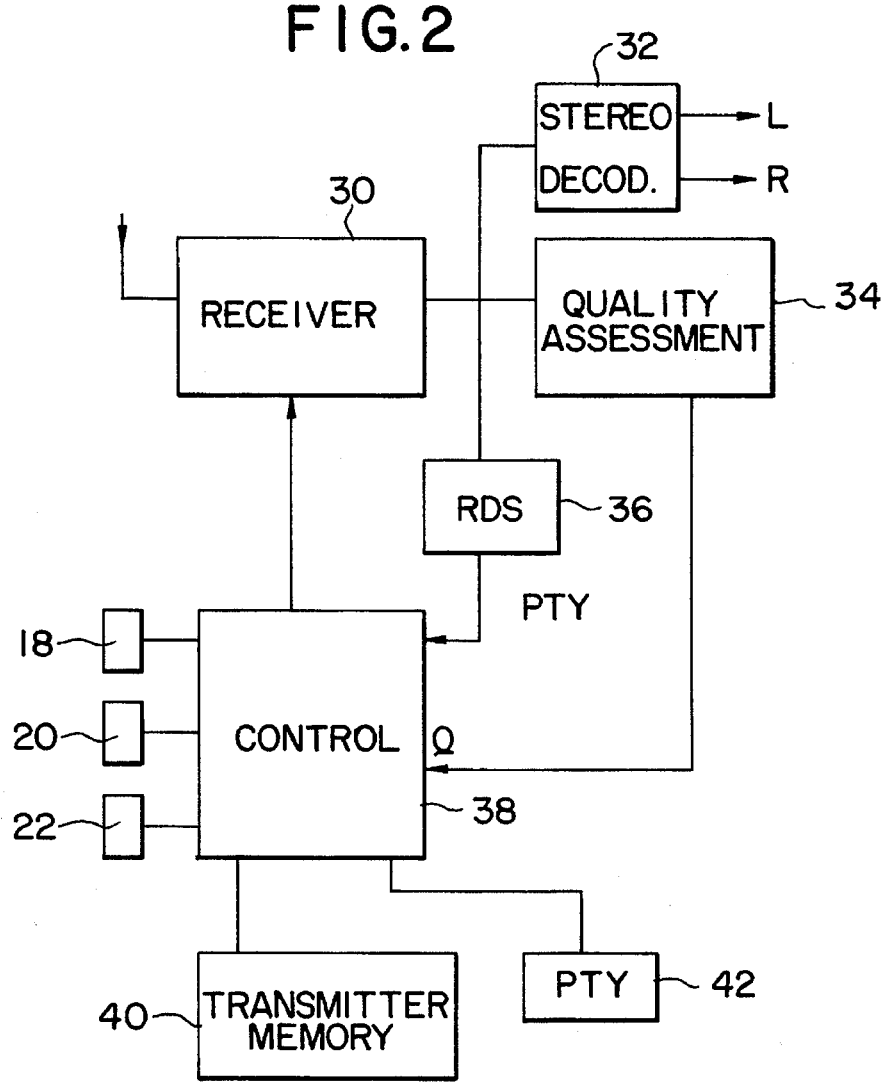
FIG. 2 is a schematic block circuit diagram of a broadcast radio receiver suitable for the performance of the method.

The main components of the broadcast radio receiver necessary for a comprehension of the invention are indicated in the block circuit diagram of FIG. 2.

The MPX output signal of a receiver 30 is supplied via a stereo-decoder 32 to the two stereo reproduction channels L and R. Furthermore the MPX signal is supplied to a quality evaluating stage 34. The MPX signal is lastly supplied to an RDS decoder 36. The functions of the receiver 30 are controlled by a control circuit 38. The switches for the knobs 18, 20, and 22 are connected with this control circuit 38. The control circuit 38 furthermore receives a signal from the RDS decoder 36, which inter alia contains the PTY information, that is to say a characteristic of the type of program in accordance with an established standard.

The output signal Q of the quality evaluation stage 34 is also supplied to the control circuit 38. Finally a transmitter memory 40 and a register 42 are connected with the control circuit 38.

A description will be now provided of the method able to be performed with this broadcast radio receiver.

After turning on the broadcast radio receiver, by operation of the knob 18 (for transmitter search sweep) the radio is tuned to a program which complies with the wishes of the listener, as for example a station which is broadcasting entertainment music. Since the listener desires to listen to entertainment music, he operates the knob 20 so that the lettering "FILTER" will be lighted up. Simultaneously a filter is set in the control circuit 38, a characteristic being stored in the register 42 to correspond to the PTY information (type of program) with respect to the transmitter just tuned in. If then the knob 18 is operated for a renewed transmitter search sweep, the PTY information obtained from the RDS data for each transmitter found is firstly compared with the characteristic held in the register 42. It is solely if there is an agreement that the search sweep is halted and the transmitter found offered for reception. The filter remains active until the knob 20 is operated again.

All transmitters found in the course of the search sweep whose PTY information is in agreement with the characteristic stored in the register 42 are stored in the transmitter memory 40. Dependent on the capabilities of the receiver 30 it is possible for a transmitter search sweep for updating the content of the transmitter memory to be performed continuously, periodically or only ad hoc. For each transmitter held in the transmitter memory 40 a quality evaluation is held in addition.

If now the knob 22 is operated there will be a setting of the receiver 30 to that one of the transmitters stored in the transmitter memory 40 which possesses the best reception quality. If following this, owing to driving to a different place, the reception quality becomes unsatisfactory, an automatic switching over to another one of the transmitters stored in the transmitter memory 40 may take place or a new transmitter search sweep may be performed.

I claim:

1. A method of tuning a broadcast radio receiver to a transmitter station, transmitting a particular type of program using Radio Data System (RDS) information, comprising the steps of:

tuning the broadcast radio receiver to any transmitter station broadcasting a program which meets the preferences of the user, extracting the program type information (PTY) from the RDS information which is broadcast by the tuned-in transmitter, operating a filter activation key to set a filter condition corresponding to the program type of the tuned-in transmitter station, triggering an automatic transmitter station search, comparing the PTY information of each transmitter station found in the station search with PTY information of the filter condition set, continuing station search until a particular transmitter station with matching PTY information is found; and stopping station search on a particular transmitter station only when the compared PTY information match.

2. The method as claimed in claim 1, wherein the filter condition is disabled by renewed operation of the filter activation key.

3. The method as claimed in claim 2, wherein an active status of the filter condition is indicated by an indicating element associated with the filter activation key.

4. The method as claimed in claim 1, wherein a transmitter station search is performed periodically and each transmitter station found is stored in a transmitter station table only if it complies with a set filter condition.

5. The method as claimed in claim 1, wherein a best station key is operated to trigger a transmitter station search, the reception quality of each transmitter station found in the search, which fulfills a set filter condition, is determined and an evaluation characteristic thereof is stored temporarily, with an associated transmission frequency and tuning the receiver to the stored transmission frequency which is associated with the best evaluation characteristic.

\* \* \* \* \*